(12) United States Patent
Kim et al.

(10) Patent No.: US 7,723,223 B2
(45) Date of Patent: May 25, 2010

(54) METHOD OF DOPING TRANSISTOR COMPRISING CARBON NANOTUBE, METHOD OF CONTROLLING POSITION OF DOPING ION, AND TRANSISTORS USING THE SAME

(75) Inventors: Un-jeong Kim, Busan (KR); Young-hee Lee, Suwon-si (KR); Jae-young Choi, Suwon-si (KR); Woo-jong Yu, Gwangju (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 47 days.

(21) Appl. No.: 12/232,958

(22) Filed: Sep. 26, 2008

(65) Prior Publication Data

US 2009/0256175 A1    Oct. 15, 2009

(30) Foreign Application Priority Data

Apr. 11, 2008    (KR)    ...... 10-2008-0033882

(51) Int. Cl.
    H01L 21/336    (2006.01)
(52) U.S. Cl. ...................... 438/585; 438/197

(58) Field of Classification Search ........ 257/44, 257/E29.07, E21.409, 46, 104; 427/561; 423/593.1; 438/99, 105, 197, 300, 585
See application file for complete search history.

(56) References Cited

U.S. PATENT DOCUMENTS

| | | | |
|---|---|---|---|
| 6,706,566 B2* | 3/2004 | Avouris et al. | 438/132 |
| 6,723,624 B2* | 4/2004 | Wang et al. | 438/585 |
| 6,852,582 B2* | 2/2005 | Wei et al. | 438/195 |
| 7,381,983 B2* | 6/2008 | Bae et al. | 257/40 |
| 7,501,650 B2* | 3/2009 | Park et al. | 257/44 |
| 2003/0122133 A1 | 7/2003 | Choi et al. | |
| 2008/0315183 A1* | 12/2008 | Kinoshita et al. | 257/24 |

* cited by examiner

*Primary Examiner*—Roy K Potter
(74) *Attorney, Agent, or Firm*—Harness, Dickey & Pierce, P.L.C.

(57) ABSTRACT

Provided are a method of doping a carbon nanotube (CNT) of a field effect transistor and a method of controlling the position of doping ions. The method may include providing a source, a drain, the CNT as a channel between the source and the drain, and a gate, applying a first voltage to the gate, and adsorbing ions on a surface of the CNT.

20 Claims, 5 Drawing Sheets

$V_g = 10V$

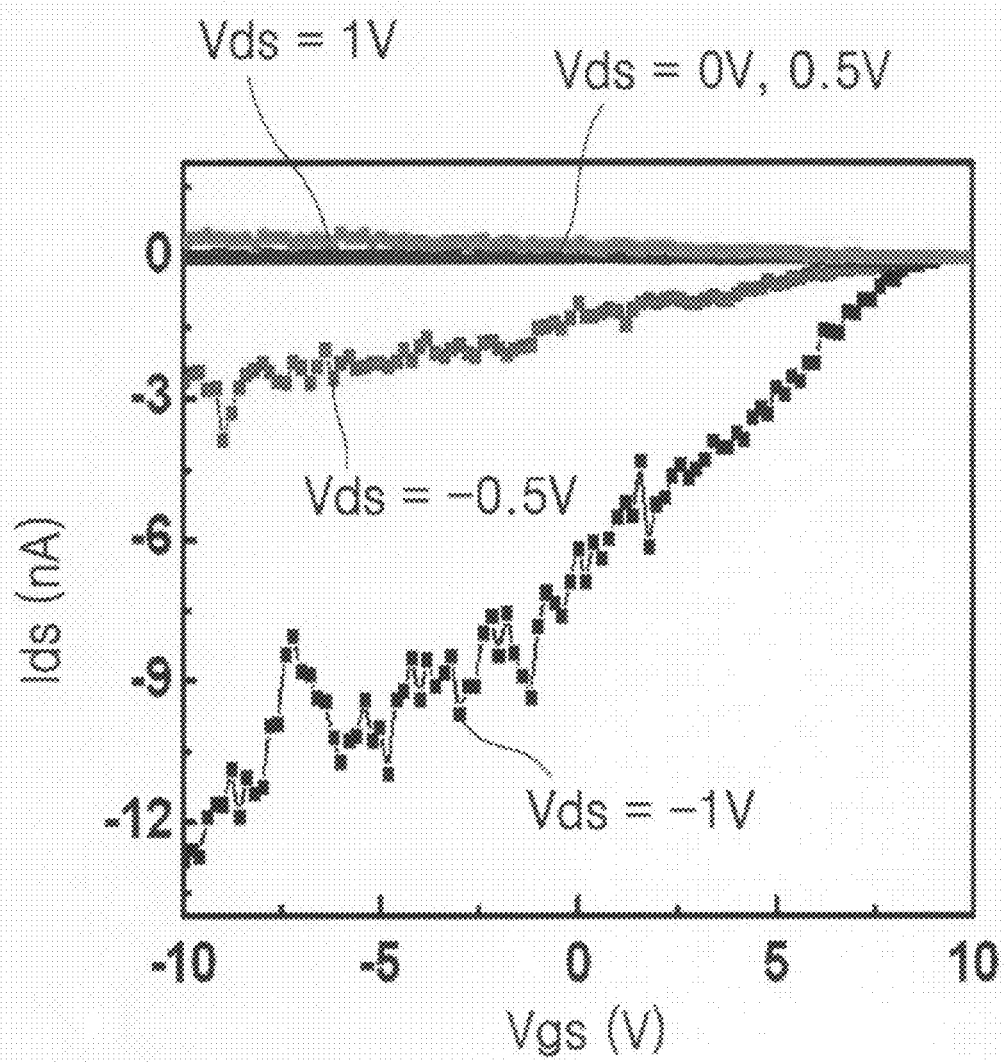

METHOD OF DOPING TRANSISTOR COMPRISING CARBON NANOTUBE, METHOD OF CONTROLLING POSITION OF DOPING ION, AND TRANSISTORS USING THE SAME

PRIORITY STATEMENT

This application claims priority under U.S.C. §119 to Korean Patent Application No. 10-2008-0033882, filed on Apr. 11, 2008, in the Korean Intellectual Property Office (KIPO), the entire contents of which are incorporated herein by reference.

BACKGROUND

1. Field

Example embodiments relate to a method of doping a field effect transistor including carbon nanotubes as a channel, a method of controlling the position of doping ions, and transistors using the same.

2. Description of the Related Art

Carbon nanotubes (CNTs) are receiving attention as a next generation nano semiconductor material that may replace silicon semiconductors because the CNTs, as a carbon allotrope, have a one-dimensional structure and show a ballistic transportation phenomenon. CNTs have improved mechanical and chemical characteristics, and may be formed to be relatively long in micrometers with a diameter from a few nanometers to a few tens of nanometers, and have increased electrical conductivity, and thus, increased applicability as a fine structure device. Studies have been conducted to apply CNTs to various devices, and thus, CNTs may be presently applied to field emission devices, optical communication fields, and bio devices.

CNTs may be manufactured by using various methods including an arc discharge method, a laser ablation method, a chemical vapor deposition (CVD) method using a catalyst, a screen printing method, or a spin coating method. In order to apply CNTs to semiconductor devices, e.g., complementary metal-oxide-semiconductor (CMOS) transistors, p-type and n-type MOS transistors are required, and CNTs are apt to be p-doped. In the related art, a method of manufacturing an n-type CNT by doping oxygen or potassium ions has been disclosed. However, oxygen ions may not be easily separated from oxygen molecules, and handling the potassium ions may be difficult.

SUMMARY

To address the above and/or other problems, example embodiments provide a method of stably doping a carbon nanotube (CNT), which is a channel of a field effect transistor. Example embodiments also provide a method of controlling the position of doping ions on a surface of a CNT of a field effect transistor, and transistors using the same.

According to example embodiments, a method of doping a carbon nanotube (CNT) of a field effect transistor may include providing a source, a drain, the CNT as a channel between the source and the drain, and a gate on a substrate, applying a first voltage to the gate, and adsorbing ions on a surface of the CNT.

Adsorbing the ions may include dropping a nitronium hexafluoroantimonate (NHFA) solution onto a surface of the CNT. The first voltage may be a positive voltage, the ions may be nitronium ions, and the CNT may be p-doped. The first voltage may be a negative voltage, the ions may be hexafluoroantimonate ions, and the CNT may be n-doped. A solvent of the NHFA solution may be methanol, and the gate may be a back gate.

The method may further include removing a surplus NHFA solution that is not adsorbed to the surface of the CNT and drying the field effect transistor to stably adsorb the ions to the surface of the CNT. The method may further include forming a passivation layer on the surface of the CNT. The substrate may be made of silicon, the gate may be made of silicon oxide, and the source and the drain may be made of gold (Au).

According to example embodiments, a method of controlling a position of ions in a field effect transistor may include doping the carbon nanotube of the field effect transistor according to example embodiments, and moving the ions on the CNT towards the drain or source by applying a second voltage between the source and the drain.

BRIEF DESCRIPTION OF THE DRAWINGS

Example embodiments will be more clearly understood from the following detailed description taken in conjunction with the accompanying drawings. FIGS. 1-7 represent non-limiting, example embodiments as described herein.

FIG. 1 is a schematic cross-sectional view of a field effect transistor having carbon nanotubes (CNT), according to example embodiments;

FIG. 2 is a cross-sectional view for explaining a method of p-type doping a field effect transistor, according to example embodiments;

FIG. 3 is a graph showing the selective removal of metal CNTs from CNTs of a CNT network structure;

FIG. 4 is a cross-sectional view for explaining a method of controlling the position of doping ions, according to example embodiments;

FIGS. 5 and 6 are graphs respectively showing I-V characteristic curves of p-doped transistors before and after controlling the position of doping ions in the transistors, according to example embodiments; and FIG. 7 is a graph showing an I-V characteristic of a p-doped transistor after controlling the position of doping ions in the transistor, according to example embodiments.

Figure 1:
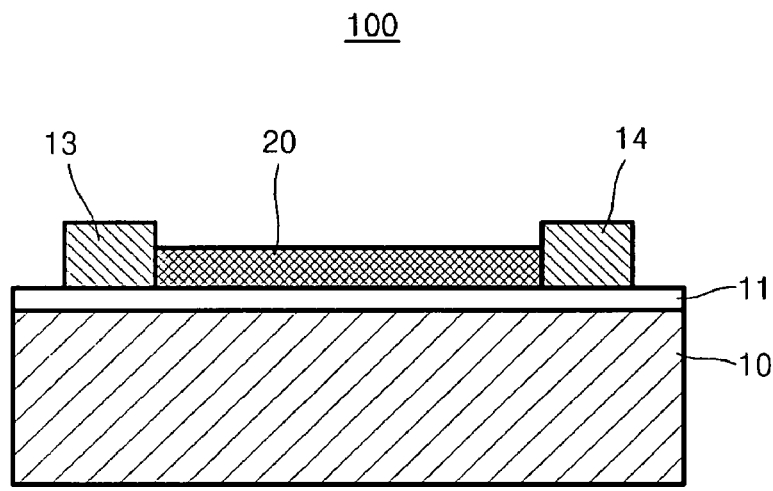

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings in which example embodiments are shown. In the drawings, the thicknesses of layers and regions are exaggerated for clarity, and like reference numerals refer to the like elements. Example embodiments may, however, be embodied in many different forms and should not be construed as being limited to the embodiments set forth herein; rather, these embodiments may be provided so that this disclosure will be thorough and complete, and will fully convey the concept of example embodiments to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, a method of doping a carbon nanotube (CNT) of a field effect transistor and a method of controlling the position of doping ions will be described. FIG. 1 is a schematic cross-sectional view of a field effect transistor 100 having a carbon nanotube (CNT), according to example embodiments. Referring to FIG. 1, a gate insulating layer 11 may be formed on a conductive substrate 10, for example, a silicon substrate. The gate insulating layer 11 may be made of silicon oxide having a thickness of about 100 nm. A source electrode 13 and a drain electrode 14 may be formed on the gate insulating layer 11. The source electrode 13 and the drain electrode 14 may be separated by about 4 μm, and may be formed of Au to a thickness of about 20 nm on a Ti adhesive layer having a thickness of about 10 nm.

A CNT 20 may be disposed between the source electrode 13 and the drain electrode 14. The CNT 20 may be random network single-walled carbon nanotubes having a network structure with a width of about 2.5 μm and may be directly grown in situ using a chemical vapor deposition (CVD) method.

A doping method according to example embodiments may stably dope a surface of the CNT 20 with ions. In order to dope the surface of the CNT with ions, a dopant solution may be prepared. The dopant solution may be readily separated into positive ions and negative ions, and may be a nitronium hexafluoroantimonate (NHFA) solution. A solvent may be ethanol, which is readily dried at room temperature. The NHFA solution may be made by dissolving NHFA powder in methanol to a concentration of about 1 μM to about 10 μM. Droplets of the NHFA solution may be dropped on the surface of the CNT 20 using a micro pipette so that the NHFA solution may be absorbed by the surface of the CNT 20. Each drop may be about 500 μL. Nitronium ions $NO_2^+$ and hexafloroantimonate ions $SbF_6^-$ may be separated in the NHFA solution.

Figure 2:
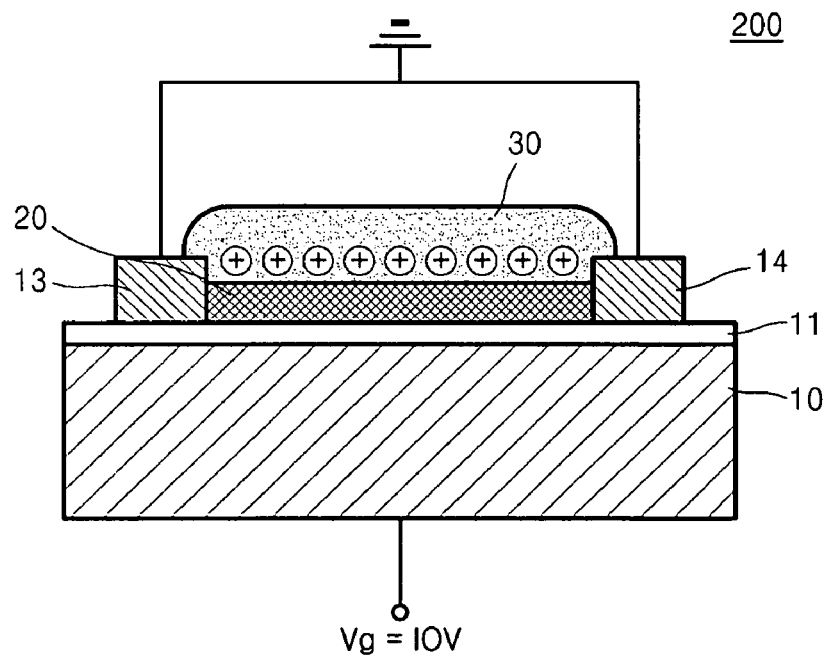

FIG. 2 is a cross-sectional view for explaining a method of p-doping a field effect transistor 200, according to example embodiments. Referring to FIG. 2, a predetermined or given positive gate voltage Vg, for example, about 10V, may be applied to the conductive substrate 10, which is a back gate, and a ground voltage may be applied to the source electrode 13 and the drain electrode 14. A droplet of the prepared NHFA solution may be dropped on the CNT 20, which is negatively charged by the gate voltage Vg.

Thus, positive $NO_2^+$ ions may be adsorbed to the surface of the CNT 20. The surplus NHFA solution and unnecessary ions may be drained by tilting the field effect transistor 200. When the conductive substrate 10 is dried, the positive nitronium ions $NO_2^+$ may be stably and ionically adsorbed on the surface of the CNT 20, and thus, the CNT 20 may be p-doped. A passivation layer 30 that stabilizes the adsorption of the positive ions on the CNT 20 may further be formed on the CNT 20. The passivation layer 30 may be formed of a photoresist material, for example, polymethyl methacrylate (PMMA).

Figure 3:
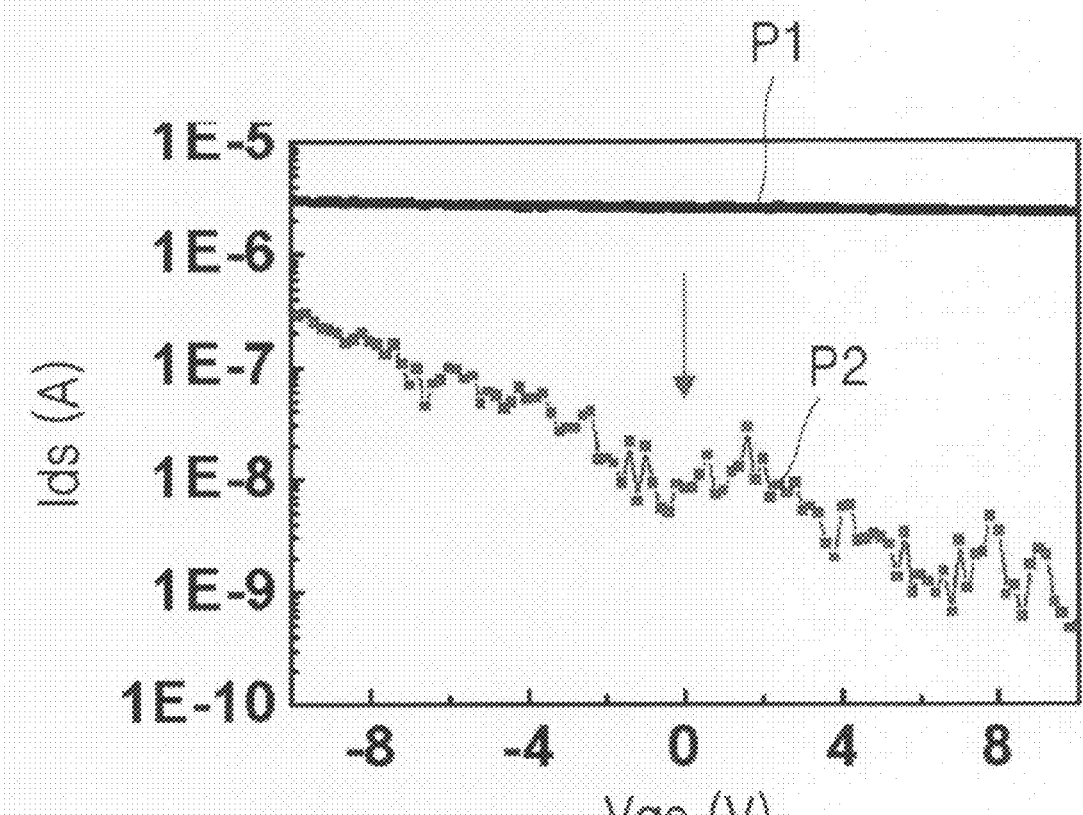

FIG. 3 is a graph showing the selective removal of metal CNTs from CNTs of a CNT network structure. Referring to FIG. 3, when a voltage of about 0.5V is applied to the drain electrode 14 of the field effect transistor 100 of FIG. 1, from the I-V characteristic plot P1, the drain current Ids may be hardly modulated and may be maintained at a relatively high level regardless of the variation of the gate voltage Vgs. The metal CNTs and the semiconductor CNTs may be mixed in the CNT network structure and the current characteristic of the field effect transistor 100 may be dominated by the metal CNTs.

In the field effect transistor 200 in which a droplet of about 1 mM NHFA solution is dropped on the CNT 20, when a voltage of about 0.5V is applied to the drain electrode 14, from the I-V characteristic plot P2, the drain current Ids may have a ON/OFF ratio of about $10^3$, which is clearly modulated. Also, the drain current Ids may be reduced, and the metal CNTs may be selectively removed from the CNT network structure.

In example embodiments, a method of p-doping a transistor (CNT) has been described, and hereinafter a method of n-doping the transistor will now be described. In order to n-dope a transistor, a predetermined or given negative voltage, for example, a gate voltage of about −10V, may be applied to the conductive substrate 10 which is a back gate, and a ground voltage may be applied to the source electrode 13 and the drain electrode 14. A droplet of the prepared NHFA solution may be dropped on the CNT 20. The CNT 20 may be positively charged by the gate voltage, and thus, hexafloroantimonate ions $SbF_6^-$ may be adsorbed to the surface of the CNT 20. Then, surplus NHFA solution and unnecessary ions may be drained by tilting the field effect transistor 100. When the conductive substrate 10 is dried, hexafloroantimonate ions $SbF_6^-$ may be stably adsorbed to the surface of the CNT 20, and thus, the CNT 20 may be n-doped.

Figure 4:
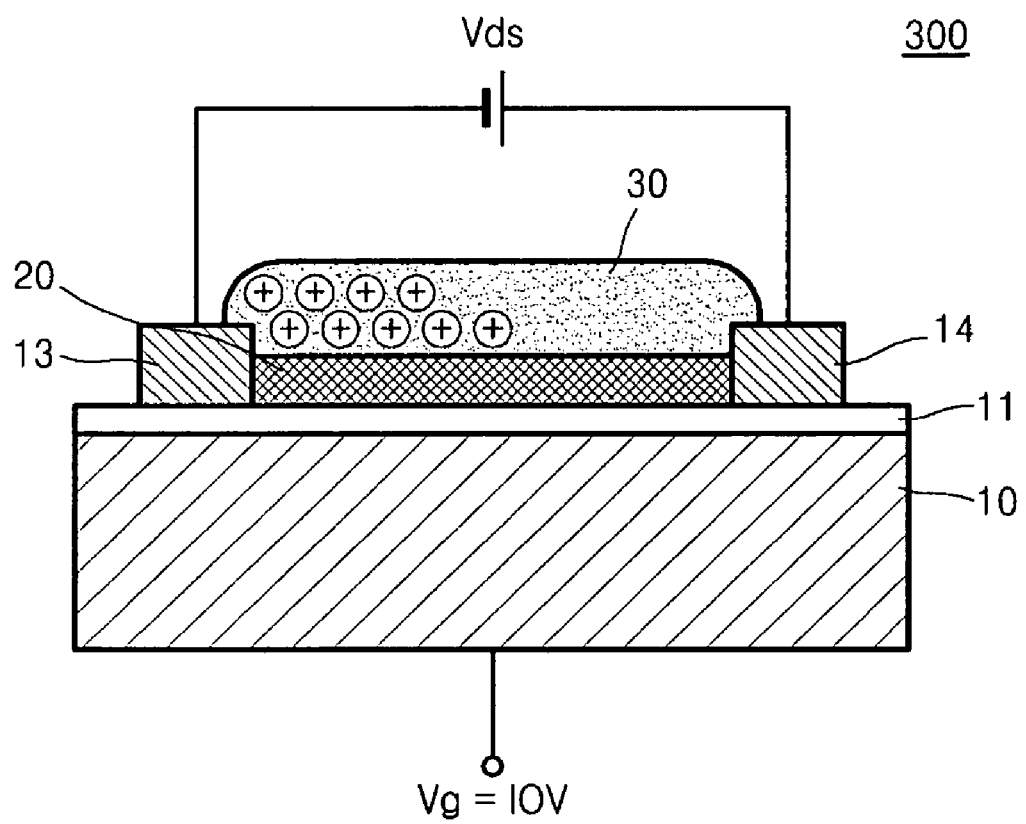

FIG. 4 is a cross-sectional view for explaining a method of controlling the position of doping ions in a field effect transistor 300 according to example embodiments. Referring to FIG. 4, a predetermined or given positive voltage, for example, a gate voltage Vg of about 10V, may be applied to the conductive substrate 10, which is a back gate, and a ground voltage may be applied to the source electrode 13 and the drain electrode 14. A droplet of the prepared NHFA solution may be dropped on the CNT 20. The CNT 20 may be negatively charged by the gate voltage Vg, and thus, nitronium ions $NO_2^+$ may be adsorbed to the surface of the CNT 20.

Then, when a voltage of about +1V is applied to the drain electrode 14, a majority of the positive ions on the CNT 20 may be moved away from the drain electrode 14 towards the source electrode 13. Thus, the position of the positive ions may be controlled to be positioned towards the source electrode 13. The increase in the positive ions on the source electrode 13 may form a Schottky barrier between the source electrode 13 and the CNT 20. Surplus NHFA solution and unnecessary ions may be drained by tilting the field effect transistor 300.

When the conductive substrate 10 is dried, the nitronium ions $NO_2^+$ may be stably adsorbed on the surface of the CNT 20, on a side near the source electrode 13. The passivation layer 30 that stabilizes the adsorption of the positive ions on the CNT 20 may further be formed on the CNT 20. The passivation layer 30 may be formed of polymethyl methacrylate (PMMA).

Figure 5:
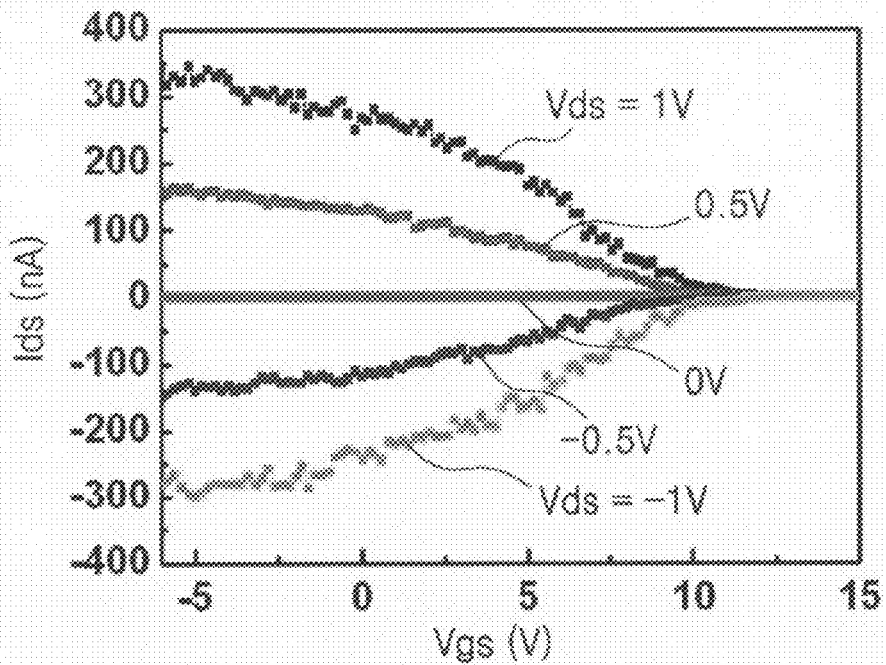
Figure 6:
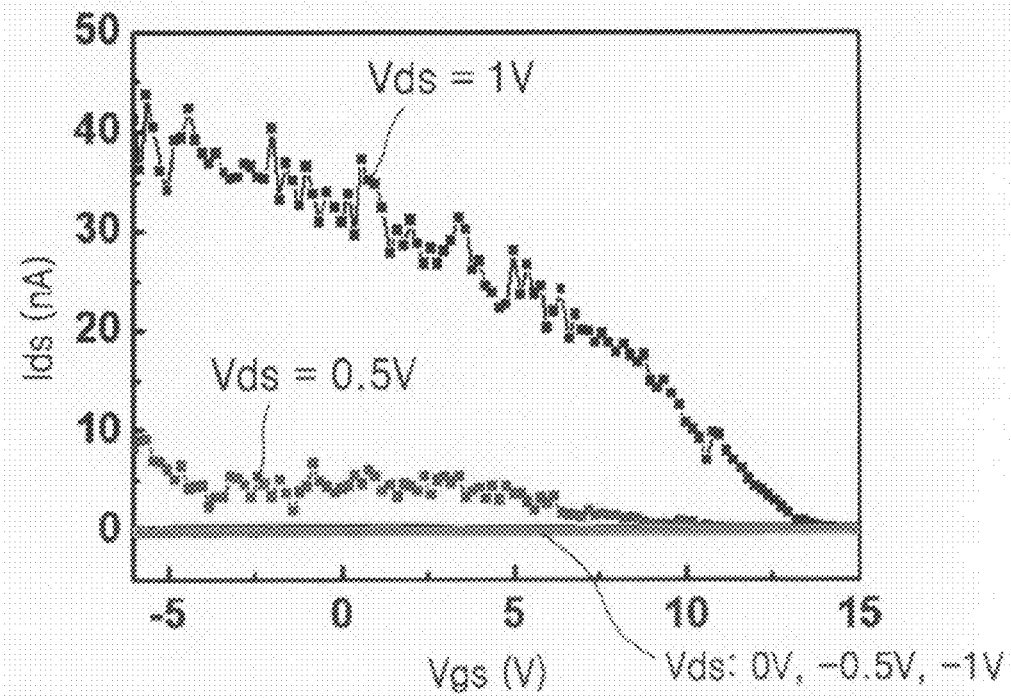

FIGS. 5 and 6 are graphs showing I-V characteristic curves of the field effect transistor 200 before controlling the position of the ion doping and the p-doped field effect transistor 300 after controlling the position of ion doping, according to example embodiments. Referring to FIG. 5, if the I-V characteristic curve is seen after applying a voltage of about 1V to about −1V to the drain electrode 14, when a gate voltage Vgs is applied to the field effect transistor 200 in a negative direction, the field effect transistor 200 may be turned on. For example, the field effect transistor 200 may be a p-type transistor.

Referring to FIG. 6, the field effect transistor 300 may be turned on when positive voltages of about 0.5V and about 1V are applied to the drain electrode 14, however, the field effect transistor 300 may not be turned on when a voltage of equal to and less than about 0V is applied to the drain electrode 14. A Schottky barrier may be formed between the source electrode 13 and the CNT 20 because positive ions on the surface of the CNT 20 may have moved towards the source electrode 13. Thus, the field effect transistor 300 shows a forward direction diode characteristic. In example embodiments, a method of controlling the position of positive ions towards the source electrode 13 is described. Hereinafter, a method of controlling the position of positive ions towards the drain electrode 14 will be described. A predetermined or given positive voltage, for example, a gate voltage of about 10V, may be applied to the conductive substrate 10, which is a back gate, and a ground voltage may be applied to the source electrode 13 and the drain electrode 14. A droplet of prepared NHFA solution may be dropped on the CNT 20. The CNT 20 may be negatively charged by the gate voltage, and thus, positive nitronium ions $NO_2^+$ may be adsorbed on the surface of the CNT 20. Then, when a voltage of about −1V is applied to the drain electrode 14, a majority of the positive ions on the CNT 20 may move toward the drain electrode 14. Thus, the position of the positive ions may be controlled to be towards the drain electrode 14. The increase in the positive ions on the drain electrode 14 may form a Schottky barrier between the drain electrode 14 and the CNT 20.

The surplus NHFA solution and unnecessary ions may be drained by tilting the field effect transistor 200. When the conductive substrate 10 is dried, the positive nitronium ions $NO_2^+$ may be stably and ionically adsorbed on the surface of the CNT 20, on a side near the source electrode 13. The passivation layer 30 that stabilizes the adsorption of the positive ions on the CNT 20 may further be formed on the CNT 20. The passivation layer 30 may be formed of polymethyl methacrylate (PMMA).

FIG. 7 is a graph showing an I-V characteristic of a p-doped transistor after controlling the position of doping ions in the transistor, according to example embodiments. Referring to FIG. 7, the field effect transistor 300 may be turned on when negative voltages of about −0.5V and about −1V are applied to the drain electrode 14, however, the field effect transistor 300 may not be turned on when a voltage equal to and greater than about 0V is applied to the drain electrode 14. A Schottky barrier may be formed between the drain electrode 14 and the channel 20 because positive ions on the surface of the CNT 20 may move towards the drain electrode 14. Thus, the field effect transistor 300 shows a backward direction diode characteristic.

In example embodiments, the method of controlling the positive ions in the p-doped transistor is described. However, the position of the negative ions in an n-doped transistor may be controlled in the same manner, and thus, the detailed description thereof will not be repeated. In a method of doping a field effect transistor including a CNT, according to example embodiments, the CNT may be stably p-doped and n-doped on the field effect transistor, and thus, a p-type transistor and an n-type transistor may be readily manufactured.

Also, in the method of controlling the position of ions in a field effect transistor, a field effect transistor having a forward or backward diode may be readily manufactured.

While example embodiments have been particularly shown and described with reference to example embodiments thereof, it will be understood by one of ordinary skill in the art that various changes in form and details may be made therein without departing from the spirit and scope of the following claims.

What is claimed is:

1. A method of doping a carbon nanotube (CNT) of a field effect transistor comprising:
    providing a source, a drain, the CNT as a channel between the source and the drain, and a gate on a substrate;
    applying a first voltage to the gate; and
    adsorbing ions on a surface of the CNT.
2. The method of claim 1, wherein adsorbing the ions includes dropping a nitronium hexafluoroantimonate (NHFA) solution onto a surface of the CNT.
3. The method of claim 2, wherein the first voltage is a positive voltage, the ions are nitronium ions, and the CNT is p-doped.
4. The method of claim 2, wherein the first voltage is a negative voltage, the ions are hexafloroantimonate ions, and the CNT is n-doped.
5. The method of claim 2, wherein a solvent of the NHFA solution is methanol.
6. The method of claim 2, further comprising:
    removing the surplus NHFA solution that is not adsorbed on the surface of the CNT; and
    drying the field effect transistor to stably adsorb the ions to the surface of the CNT.
7. The method of claim 6, further comprising:
    forming a passivation layer on the surface of the CNT.
8. The method of claim 1, wherein the gate is made of silicon oxide.
9. The method of claim 1, wherein the source and the drain are made of gold (Au).
10. The method of claim 1, wherein the substrate is made of silicon.
11. A method of controlling a position of ions in a field effect transistor comprising:
    doping the carbon nanotube (CNT) of the field effect transistor according to claim 1; and
    moving the ions on the CNT towards the drain or the source by applying a second voltage between the source and the drain.
12. The method of claim 11, wherein adsorbing the ions includes dropping a nitronium hexafluoroantimonate (NHFA) solution onto a surface of the CNT.
13. The method of claim 12, wherein the first voltage is a positive voltage, the ions are nitronium ions, and the CNT is p-doped.
14. The method of claim 13, wherein the second voltage is a positive voltage, and the field effect transistor has a forward direction diode characteristic by moving the nitronium ions towards the source.
15. The method of claim 13, wherein the second voltage is a negative voltage, and the field effect transistor has a backward diode characteristic by moving the nitronium ions towards the drain.
16. The method of claim 11, wherein a solvent of the NHFA solution is methanol.
17. The method of claim 12, further comprising:
    removing the surplus NHFA solution that is not adsorbed on the surface of the CNT; and
    drying the field effect transistor to stably adsorb the ions to the surface of the CNT.
18. The method of claim 17, further comprising:
    forming a passivation layer on the surface of the CNT.
19. A field effect transistor manufactured using the method of claim 1.
20. A field effect transistor manufactured using the method of claim 11.

* * * * *